United States Patent [19]
Oh

[11] Patent Number: 5,818,895
[45] Date of Patent: Oct. 6, 1998

[54] HIGH-SPEED COUNTER CIRCUIT

[75] Inventor: Jong Hoon Oh, Ami-ri, Rep. of Korea

[73] Assignee: Hyundai Electronics Industries Co., Ltd., Ichon-shi, Rep. of Korea

[21] Appl. No.: 649,762

[22] Filed: May 15, 1996

[30] Foreign Application Priority Data

May 15, 1995 [KR] Rep. of Korea ........... 1995-11881

[51] Int. Cl.$^6$ ................................. H03K 21/16
[52] U.S. Cl. ....................... 337/118; 377/116; 377/117
[58] Field of Search ........................... 377/118, 116, 377/111

[56] References Cited

FOREIGN PATENT DOCUMENTS

403257379  11/1991  Japan .......................... 377/111

Primary Examiner—Margaret Rose Wambach
Attorney, Agent, or Firm—Reid & Priest L.L.P.

[57] ABSTRACT

A high-speed counter circuit comprising an input line for inputting a clock signal, at least two bit counters for generating a count value of at least two bits in response to the clock signal from the input line, at least one clock synchronizing circuit responsive to an output signal from at least one higher-order bit counter of the at least two bit counters, for transferring the clock signal from the input line to a lower-order bit counter of the at least two bit counters, and a delay circuit for delaying the clock signal from the input line by a propagation delay time of the at least one clock synchronizing circuit and applying the delayed clock signal to a highest-order bit counter of the at least two bit counters. According to the present invention, the high-speed counter circuit can minimize a delay time from the application of the clock signal to the generation of the count value to enhance the operation speed.

16 Claims, 5 Drawing Sheets

HIGH-SPEED COUNTER CIRCUIT

BACKGROUND OF THE INVENTION

1. Field of the Invention

The present invention relates in general to counter circuits used in semiconductor memory devices, and more particularly to a high-speed counter circuit which is capable of minimizing a propagation delay time to enhance the operation speed.

2. Description of the Prior Art

Generally, a semiconductor memory device such as a dynamic random access memory (referred to hereinafter as DRAM) comprises a counter circuit to perform a refresh operation. The refresh operation is performed to refresh the semiconductor memory device with charge so that data stored in a plurality of memory cell arrays in the memory device can be maintained as they are. To this end, the counter circuit in the semiconductor memory device sequentially generates addresses to the memory cell arrays.

A synchronous DRAM has recently been developed. The synchronous DRAM comprises a counter circuit to perform burst write and read operations as well as the refresh operation. The burst write operation is performed to sequentially write data in a plurality of memory cells in the synchronous DRAM which are externally designated. The burst read operation is perform to sequentially read data from a plurality of memory cells in the synchronous DRAM which are externally designated. To this end, the counter circuit in the synchronous DRAM sequentially generates addresses from a start address to an end address. Noticeably, the addresses generated by the counter circuit in the synchronous DRAM must be matched with external synchronous clocks. However, the generated addresses are not matched with the external synchronous clocks because of a propagation delay of the counter circuit in the synchronous DRAM. For this reason, such a conventional counter circuit causes a faulty operation of the synchronous DRAM. The above problem with the conventional counter circuit will hereinafter be described in detail with reference to FIGS. 1 to 3.

Figure 1:
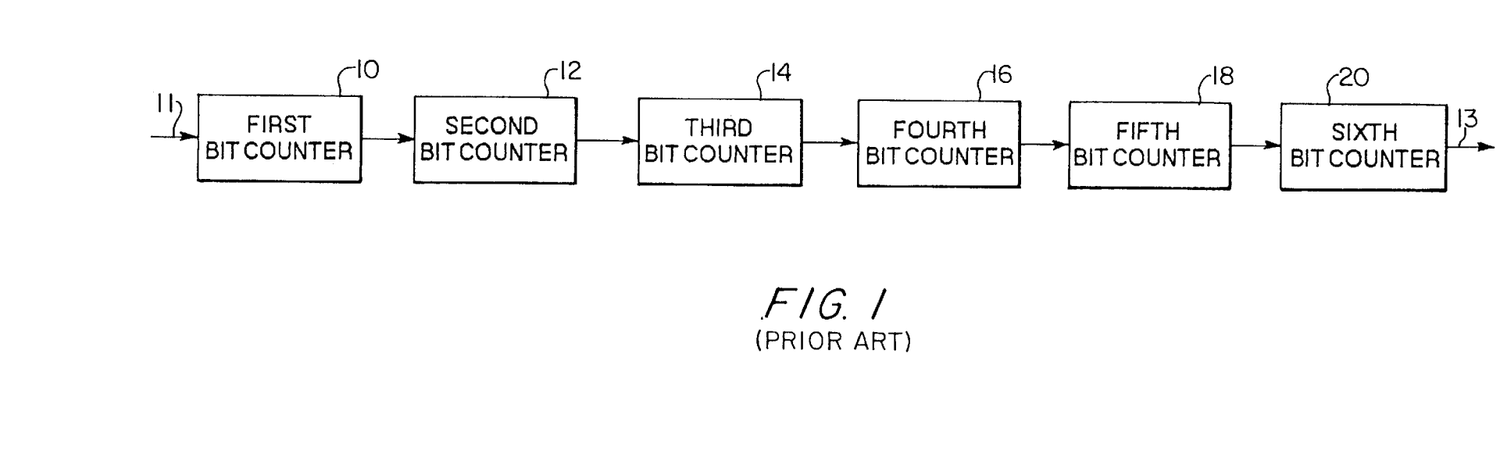
FIG. 1 is a block diagram of a conventional 6-bit counter circuit.
Figure 2:
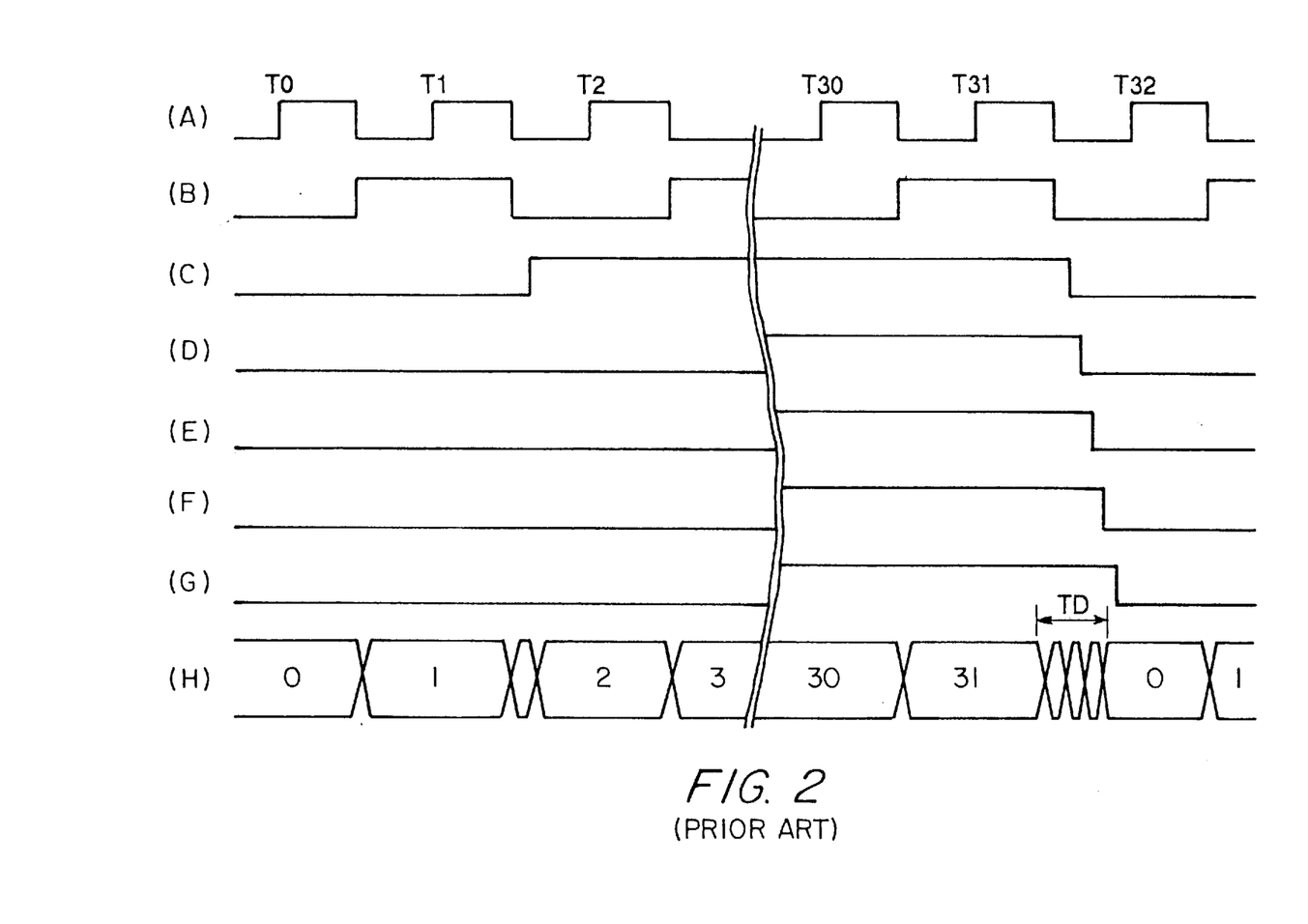
FIG. 2 includes timing diagrams illustrating the operation of the conventional 6-bit counter circuit in FIG. 1.

FIG. 1 is a block diagram of a conventional 6-bit counter circuit and FIGS. 2A to 2H are timing diagrams illustrating the operation of the conventional 6-bit counter circuit in FIG. 1. As shown in FIG. 1, the conventional 6-bit counter circuit comprises first to sixth bit counters 10, 12, 14, 16, 18, and 20 connected in series to a clock input line 11.

When an external clock signal as shown in FIG. 2A is applied to the clock input line 11, the first bit counter 10 inverts its output signal at each falling edge of the clock signal from the clock input line 11 to generate a pulse signal as shown in FIG. 2B which has half a frequency of the clock signal from the clock input line 11. The second bit counter 12 inverts its output signal at each falling edge of an output signal from the first bit counter 10 to generate a pulse signal as shown in FIG. 2C which has half a frequency of the output signal from the first bit counter 10. In a similar manner to the second bit counter 12, the third to sixth bit counters 14, 16, 18 and 20 generate pulse signals as shown in FIGS. 2D to 2G which have half frequencies of output signals from the second to fifth bit counters 12, 14, 16 and 18, respectively. In result, the first to sixth bit counters 10, 12, 14, 16, 18 and 20 cyclically generate sequential addresses from "0" to "31".

Noticeably, the output signal from the first bit counter 10 is generated after a propagation delay time of the first bit counter 10 from the falling edge of the clock signal from the clock input line 11. But, the output signals from the second to sixth bit counters 12, 14, 16, 18 and 20 are generated, respectively, after the sum of propagation delay times of the corresponding bit counter and lower-order bit counters from the falling edge of the clock signal from the clock input line 11. For example, if a count value is reset from "31" to "0", the output signal from the sixth bit counter 20 is generated after the sum (i.e., TD in FIG. 2H) of the propagation delay times of the first to sixth bit counters 10, 12, 14, 16, 18 and 20 from the falling edge of the clock signal from the clock input line 11.

Figure 3:
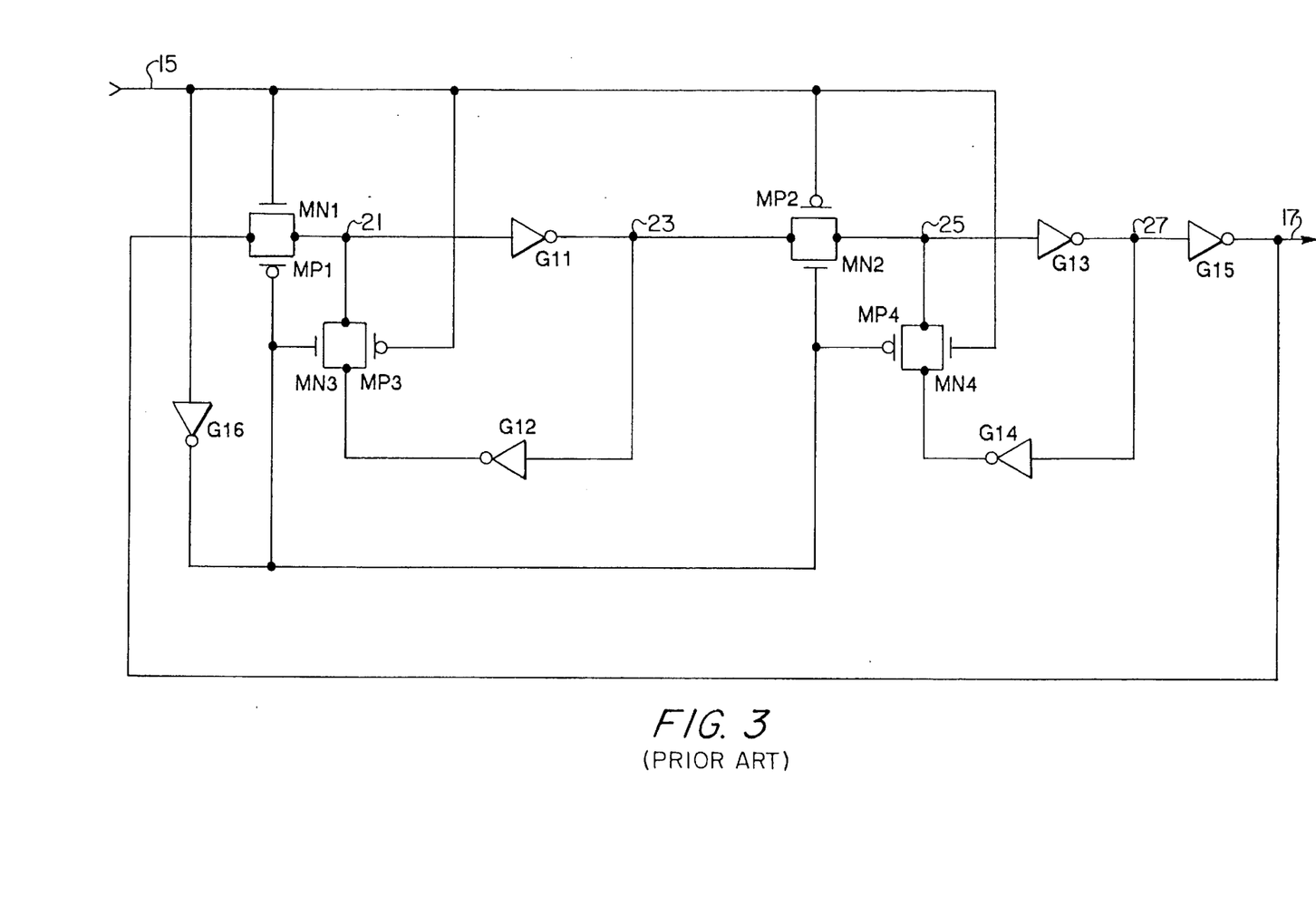
FIG. 3 is a detailed circuit diagram of a bit counter in FIG. 1.

FIG. 3 is a detailed circuit diagram of each of the first to sixth bit counters 10, 12, 14, 16, 18 and 20 in FIG. 1. As shown in this drawing, the bit counter includes two inverters GI1 and GI2 connected between first and second nodes 21 and 23 to form a cyclic loop, and PMOS and NMOS transistors MP3 and MN3 for opening/closing the cyclic loop of the inverters FI1 and GI2 in response to a pulse signal from an input line 15. The PMOS and NMOS transistors MP3 and MN3 are adapted to close the inverter cyclic loop when the pulse signal from the input line 15 is low in logic.

The bit counter further includes two inverters GI3 and GI4 connected between third and fourth nodes 25 and 27 to form a cyclic loop, an inverter GI5 connected between the fourth node 27 and an output line 17, and PMOS and NMOS transistors MP4 and MN4 for opening/closing the cyclic loop of the inverters GI3 and GI4 in response to the pulse signal from the input line 15. The PMOS and NMOS transistors MP4 and MN4 are adapted to close the inverter cyclic loop when the pulse signal from the input line 15 is high in logic. The inverter GI5 inverts a logic value (1 or 0) at the fourth node 27 which is stored by the cyclic loop of the inverters GI3 and GI4 and transfers the inverted logic value to the output line 17.

The bit counter further includes NMOS and PMOS transistors MN1 and MP1 for transferring a logic signal on the output line 17 to the first node 21 in response to the pulse signal from the input line 15, NMOS and PMOS transistors MN2 and MP2 for transferring a logic signal at the second node 23 to the third node 25 in response to the pulse signal from the input line 15, and an inverter GI6 for inverting the pulse signal from the input line 15. The NMOS and PMOS transistors MN1 and MP1 are adapted to transfer the logic signal on the output line 17 to the first node 21 when the pulse signal from the input line 15 is "1" in logic. To the contrary, the NMOS and PMOS transistors MN2 and MP2 are adapted to transfer the logic signal at the second node 23 to the third node 25 when the pulse signal from the input line 15 is "0" in logic. The pulse signal from the input line 15 is applied in common to gate terminals of the two NMOS transistors MN1 and MN4 and two PMOS transistors MP2 and MP3. The output signal from the inverter GI6 is applied in common to gate terminals of the two NMOS transistors MN2 and MN3 and two PMOS transistors MP1 and MP4.

As mentioned above, the conventional counter circuit is disadvantageous in that its output signal has the very low response speed with respect to the clock signal, thereby causing the count value not to be matched with the clock signal. For this reason, the conventional counter circuit causes a faulty operation of the semiconductor memory device, resulting in a degradation in the reliability thereof.

SUMMARY OF THE INVENTION

Therefore, the present invention has been made in view of the above problem, and it is an object of the present invention to provide a high-speed counter circuit which is capable of enhancing a response speed of an output signal with respect to a clock signal.

In accordance with one aspect of the present invention, there is provided a high-speed counter circuit comprising an input line for inputting a clock signal; at least two bit counters for generating a count value of at least two bits in response to the clock signal from the input line; and at least one clock synchronizing means responsive to an output signal from at least one higher-order bit counter of the at least two bit counters, for transferring the clock signal from the input line to a lower-order bit counter of the at least two bit counters.

In accordance with another aspect of the present invention, there is provided a high-speed counter circuit comprising an input line for inputting a clock signal; at least two bit counters for generating a count value of at least two bits in response to the clock signal from the input line; at least one clock synchronizing means responsive to an output signal from at least one higher-order bit counter of the at least two bit counters, for transferring the clock signal from the input line to a lower-order bit counter of the at least two bit counters; and delay means for delaying the clock signal from the input line by a propagation delay time of the at least one clock synchronizing means and applying the delayed clock signal to a highest-order bit counter of the at least two bit counters.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 4:
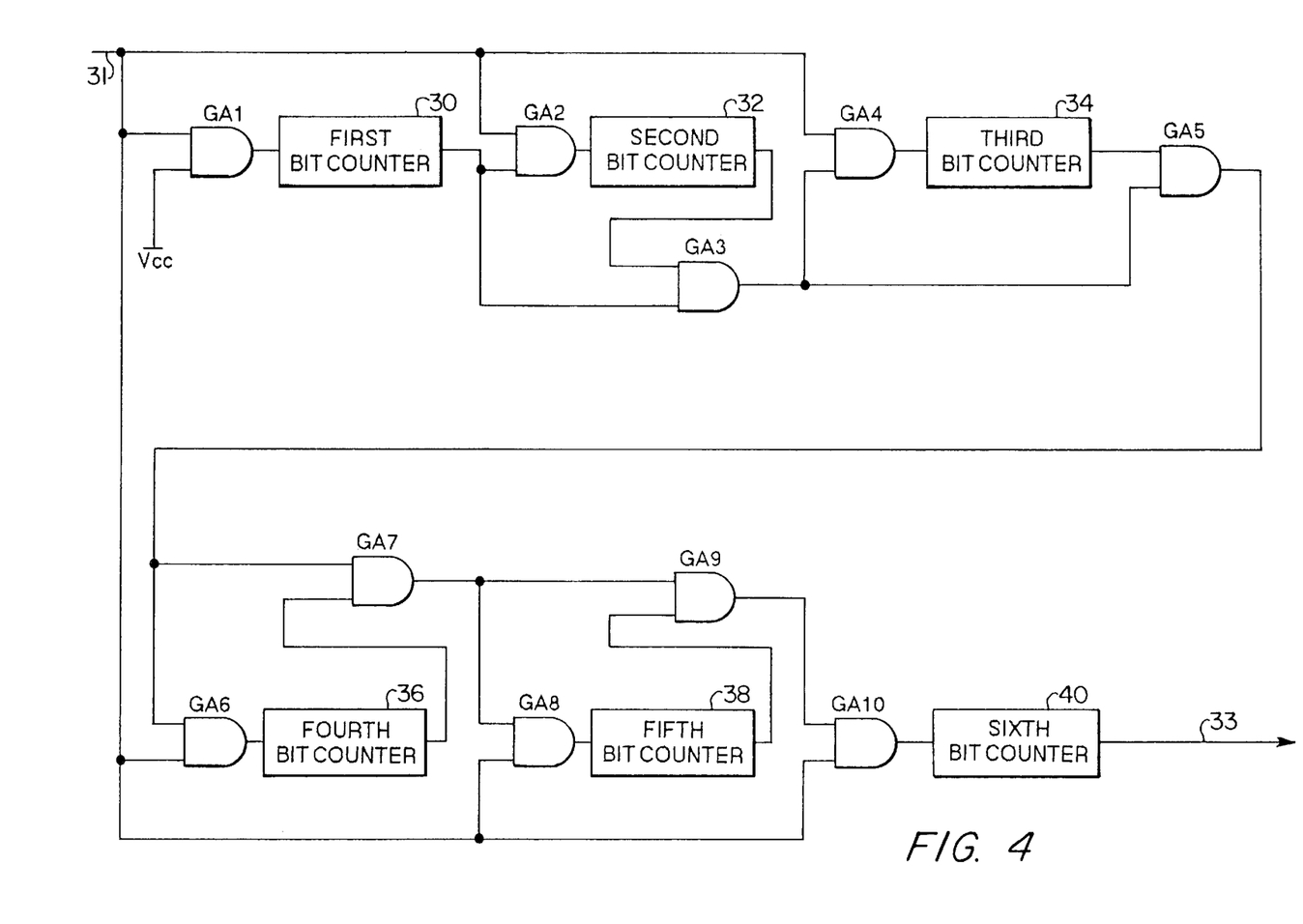
FIG. 4 is a circuit diagram of a 6-bit high-speed counter circuit in accordance with an embodiment of the present invention.

Referring to FIG. 4, there is shown a circuit diagram of a 6-bit high-speed counter circuit in accordance with an embodiment of the present invention. As shown in this drawing, the 6-bit high-speed counter circuit comprises a first AND gate GA1 for inputting a clock signal from an input line 31 and a supply voltage Vcc from a supply voltage source Vcc, and a first bit counter 30 for performing its counting operation in response to an output signal from the first AND gate GA1. The first AND gate GA1 is adapted to transfer the clock signal from the input line 31 to a clock terminal of the first bit counter 30 while the supply voltage Vcc from the supply voltage source Vcc is applied. The output signal from the first AND gate GA1 has the same frequency as that of the clock signal from the input line 31 and a pulse duration longer than that of the clock signal by a propagation delay time of the first AND gate GA1. The first bit counter 30 inverts its output signal at each falling edge of the output signal from the first AND gate GA1. The first bit counter 30 inverts its output signal at each falling edge of the output signal from the first AND gate GA1 to generate a first count signal which has half a frequency of the clock signal from the input line 31.

The 6-bit high-speed counter circuit further comprises a second AND gate GA2 for inputting the first count signal from the first bit counter 30 and the clock signal from the input line 31, a second bit counter 32 for performing its counting operation in response to an output signal from the second AND gate GA2 to generate a second count signal, and a third AND gate GA3 for inputting the first and second count signals from the first and second bit counters 30 and 32. The second AND gate GA2 ANDs the first count signal from the first bit counter 30 and the clock signal from the input line 31. As a result of the AND operation, the second AND gate GA2 generates a pulse signal which has half a frequency of the clock signal from the input line 31 and a pulse duration longer than that of the clock signal by a propagation delay time of the second AND gate GA2. The second bit counter 32 inverts its output signal at each falling edge of the pulse signal from the second AND gate GA2 to generate the second count signal. In result, the second bit counter 32 performs its counting operation in response to the clock signal from the input line 31 while the first count signal from the first bit counter 30 is high in logic. The third AND gate GA3 ANDs the first and second count signals from the first and second bit counters 30 and 32 to detect a time point that the first and second count signals are both high in logic. As a result of the AND operation, the third AND gate GA3 generates a pulse signal which has half a frequency of the first count signal from the first bit counter 30 and the same pulse duration as that of the first count signal.

The 6-bit high-speed counter circuit further comprises a fourth AND gate GA4 for inputting the output signal from the third AND gate GA3 and the clock signal from the input line 31, a third bit counter 34 for performing its counting operation in response to an output signal from the fourth AND gate GA4 to generate a third count signal, and a fifth AND gate GA5 for inputting the output signal from the third AND gate GA3 and the third count signal from the third bit counter 34. The fourth AND gate GA4 ANDs the output signal from the third AND gate GA3 and the clock signal from the input line 31 to synchronize the output signal from the third AND gate GA3 with the clock signal from the input line 31. As a result of the AND operation, the fourth AND gate GA4 generates a pulse signal which has ¼ a frequency of the clock signal from the input line 31 and a pulse duration longer than that of the clock signal by a propagation delay time of the fourth AND gate GA4. The third bit counter 34 inverts its output signal at each falling edge of the pulse signal from the fourth AND gate GA4 to generate the third count signal. In result, the third bit counter 34 performs its counting operation in response to the clock signal from the input line 31 while the first and second count signals from the first and second bit counters 30 and 32 are both high in logic. The fifth AND gate GA5 ANDs the output signal from the third AND gate GA3 and the third count signal from the third bit counter 34 to detect a time point that the first to third count signals from the first to third bit counters 30, 32 and 34 are all high in logic. As a result of the AND operation, the fifth AND gate GA5 generates a pulse signal which has ¼ a frequency of the first count signal from the first bit counter 30 and the same pulse duration as that of the first count signal.

The 6-bit high speed counter circuit further comprises a sixth AND gate GA6 for inputting the output signal from the fifth AND gate GA5 and the clock signal from the input line 31, a fourth bit counter 36 for performing its counting operation in response to an output signal from the sixth AND gate GA6 to generate a fourth count signal, and a seventh AND gate GA7 for inputting the output signal from the fifth AND gate GA5 and the fourth count signal from the fourth bit counter 36. The sixth AND gate GA6 is adapted to transfer the clock signal from the input line 31 to a clock terminal of the fourth bit counter 36 while the output signal from the fifth AND gate GA5 is high in logic. The output signal from the sixth AND gate GA6 has ⅛ a frequency of the clock signal from the input line 31 and a pulse duration longer than that of the clock signal by a propagation delay time of the sixth AND gate GA6. The fourth bit counter 36 inverts its output signal at each falling edge of the pulse signal from the sixth AND gate GA6 to generate the fourth count signal. The fourth count signal from the fourth bit counter 36 has a 1/16 a frequency of the clock signal from the input line 31 and a duty cycle of 50%. The seventh AND gate GA7 ANDs the output signal from the fifth AND gate GA5 and the fourth count signal from the fourth bit counter 36 to detect a time point that the first to fourth count signals from the first to fourth bit counters 30, 32, 34 and 36 are all high in logic. As a result of the AND operation, the seventh AND gate GA7 generates a pulse signal which has ⅛ a frequency of the first count signal from the first bit counter 30 and the same pulse duration as that of the first count signal.

The 6-bit high-speed counter circuit further comprises an eighth AND gate GA8 for inputting the output signal from the seventh AND gate GA7 and the clock signal from the input line 31, a fifth bit counter 38 for performing its counting operation in response to an output signal from the eighth AND gate GA8 to generate a fifth count signal, and a ninth AND gate GA9 for inputting the output signal from the seventh AND gate GA7 and the fifth count signal from the fifth bit counter 38. The eighth AND gate GA8 is adapted to transfer the clock signal from the input line 31 to a clock terminal of the fifth bit counter 38 while the output signal from the seventh AND gate GA7 is high in logic. The output signal from the eighth AND gate GA8 has 1/16 a frequency of the clock signal from the input line 31 and a pulse duration longer than that of the clock signal by a propagation delay time of the eighth AND gate GA8. The fifth bit counter 38 inverts its output signal at each falling edge of the pulse signal from the eighth AND gate GA8 to generate the fifth count signal. The fifth count signal from the fifth bit counter 38 has 1/32 a frequency of the clock signal from the input line 31 and a duty cycle of 50%. The ninth AND gate GA9 ANDs the output signal from the seventh AND gate GA7 and the fifth count signal from the fifth bit counter 38 to detect a time point that the first to fifth count signals from the first to fifth bit counters 30, 32, 34, 36 and 38 are all high in logic. As a result of the AND operation, the ninth AND gate GA9 generates a pulse signal which has 1/16 a frequency of the first count signal from the first bit counter 30 and the same pulse duration as that of the first count signal.

The 6-bit high-speed counter circuit further comprises a tenth AND gate GA10 for inputting the output signal from the ninth AND gate GA9 and the clock signal from the input line 31, and a sixth bit counter 40 for performing its counting operation in response to an output signal from the tenth AND gate GA10 to generate a sixth count signal. The tenth AND gate GA10 is adapted to transfer the clock signal from the input line 31 to a clock terminal of the sixth bit counter 40 while the output signal from the ninth AND gate GA9 is high in logic. The output signal from the tenth AND gate GA10 has 1/32 a frequency of the clock signal from the input line 31 and a pulse duration longer than that of the clock signal by a propagation delay time of the tenth AND gate GA10. The sixth bit counter 40 inverts its output signal at each falling edge of the pulse signal from the tenth AND gate GA10 to generate the sixth count signal. The sixth count signal from the sixth bit counter 40 has 1/64 a frequency of the clock signal from the input line 31 and a duty cycle of 50%. Then, the sixth bit counter 40 outputs the sixth count signal to an output line 33.

In result, the first to sixth bit counters 30, 32, 34, 36, 38 and 40 are operated synchronously with the clock signal from the input line 31 in such a manner that they generate their output signals, respectively, after the sum of propagation delay times of one AND gate and one bit counter from the falling edge of the clock signal.

Figure 5:
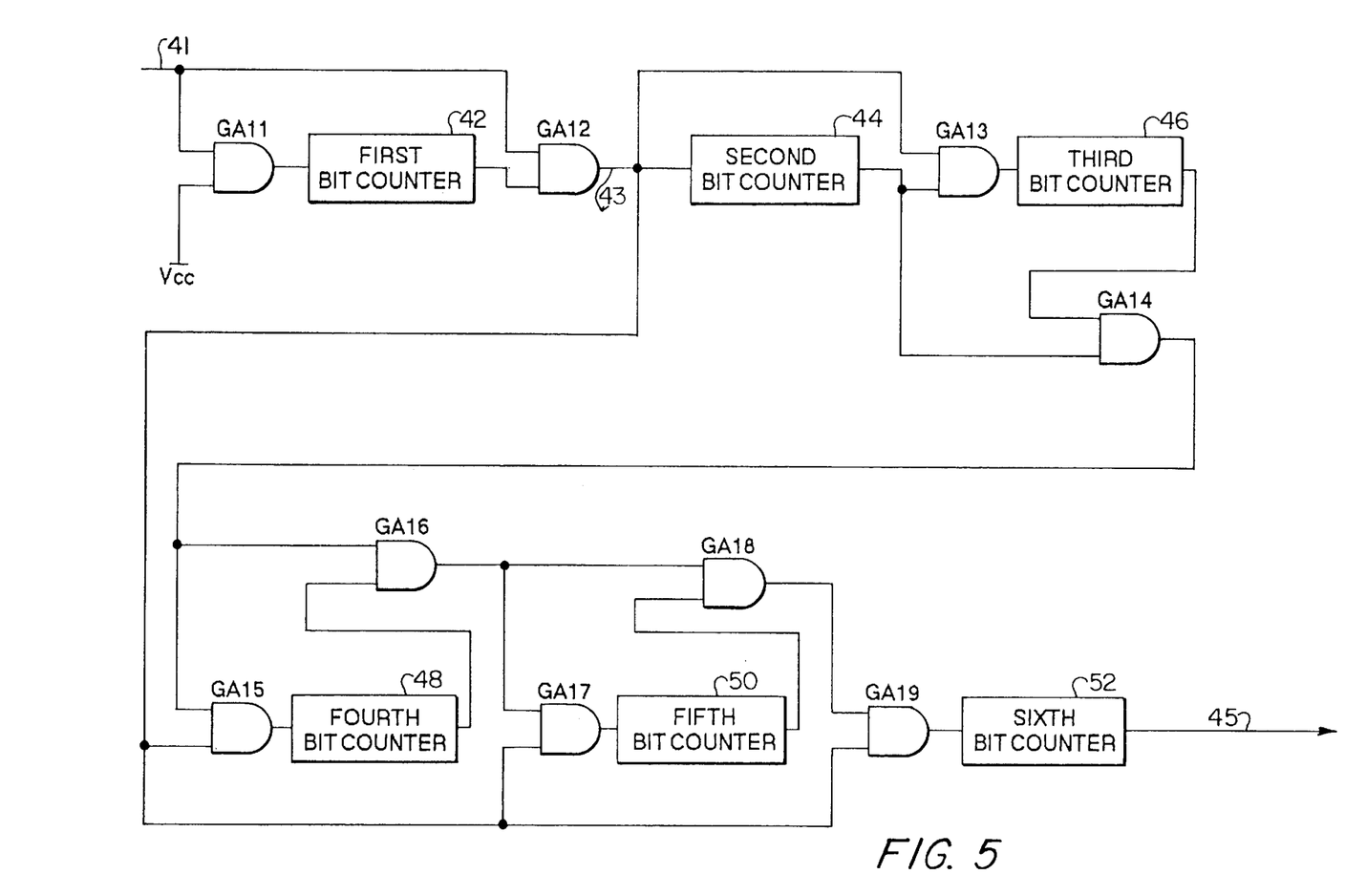
FIG. 5 is a circuit diagram of a 6-bit high-speed counter circuit in accordance with an alternative embodiment of the present invention.

Referring to FIG. 5, there is shown a circuit diagram of a 6-bit high-speed counter circuit in accordance with an alternative embodiment of the present invention. As shown in this drawing, the 6-bit high-speed counter circuit comprises a first AND gate GA11 for inputting a first clock signal from an input line 41 and a supply voltage Vcc from a supply voltage source Vcc, a first bit counter 42 for performing its counting operation in response to an output signal from the first AND gate GA11 to generate a first count signal, and a second AND gate GA12 for ANDing the first count signal from the first bit counter 42 and the first clock signal from the input line 41. The first AND gate GA11 is adapted to transfer the first clock signal from the input line 41 to a clock terminal of the first bit counter 42 while the supply voltage Vcc from the supply voltage source Vcc is applied. The first bit counter 42 inverts its output signal at each falling edge of the output signal from the first AND gate GA11 to generate the first count signal. The first count signal from the first bit counter 42 has half a frequency of the clock signal from the input line 41. The second AND gate GA12 is adapted to transfer the first clock signal from the input line 41 to a node 43 while the first count signal from the first bit counter 42 is high in logic. As a result, a second clock signal is generated at the node 43. The second clock signal has half a frequency of the first clock signal from the input line 41 and pulses synchronized with those of the first clock signal. The second clock signal also has a pulse duration longer than that of the first clock signal by a propagation delay time of the second AND gate GA12.

The 6-bit high-speed counter circuit further comprises a second bit counter 44 for performing its counting operation in response to the second clock signal at the node 43 to generate a second count signal, and a third AND gate GA13 for inputting the second clock signal at the node 43 and the second count signal from the second bit counter 44. The second bit counter 44 inverts its output signal at each falling edge of the second clock signal at the node 43 to generate the second count signal. The second count signal from the second bit counter 44 has half a frequency of the second clock signal at the node 43 and a duty cycle of 50%. The third AND gate GA13 is adapted to transfer the second clock signal at the node 43 to its output terminal while the second count signal from the second bit counter 44 is high in logic. The output signal from the third AND gate GA13 has half a frequency of the second clock signal at the node 43 and pulses synchronized with those of the second clock signal. The output signal from the third AND gate GA13 also has a pulse duration longer than that of the second clock signal at the node 43 by a propagation delay time of the third AND gate GA13.

The 6-bit high-speed counter circuit further comprises a third bit counter 46 for performing its counting operation in response to the output signal from the third AND gate GA13 to generate a third count signal, and a fourth AND gate GA14 for inputting the second and third count signals from the second and third bit counters 44 and 46. The third bit counter 46 inverts its output signal at each falling edge of the pulse signal from the third AND gate GA13 to generate the third count signal. In result, the third bit counter 46 performs its counting operation in response to the second clock signal at the node 43 wile the second count signal from the second bit counter 44 is high in logic. The third count signal from the third bit counter 46 has ¼ a frequency of the second clock signal at the node 43 and a duty cycle of 50%. The fourth AND gate GA14 ANDs the second and third count signals from the second and third bit counters 44 and 46 to detect a time point that the second and third count signals are both high in logic. As a result of the AND operation, the fourth AND gate GA14 generates a pulse signal which has ½ a frequency of the second count signal from the second bit counter 44 and the same pulse duration as that of the second count signal.

The 6-bit high-speed counter circuit further comprises a fifth AND gate GA15 for inputting the output signal from the fourth AND gate GA14 and the second clock signal at the node 43, a fourth bit counter 48 for performing its counting operation in response to an output signal from the fifth AND gate GA15 to generate a fourth count signal, and a sixth AND gate GA16 for inputting the output signal from the fourth AND gate GA14 and the fourth count signal from the fourth bit counter 48. The fifth AND gate GA15 is adapted to transfer the second clock signal at the node 43 to a clock terminal of the fourth bit counter 48 while the output signal from the fourth AND gate GA14 is high in logic. The output signal from the fifth AND gate GA15 has ¼ a frequency of the second clock signal at the node 43 and pulses synchronized with those of the second clock signal. The output signal from the fifth AND gate GA15 also has a pulse duration longer than that of the second clock signal by a propagation delay time of the fifth AND gate GA15. The fourth bit counter 48 inverts its output signal at each falling edge of the pulse signal from the fifth AND gate GA15 to generate the fourth count signal. The fourth count signal from the fourth bit counter 48 has ⅛ a frequency of the second clock signal at the node 43 and a duty cycle of 50%. The sixth AND gate GA16 ANDs the output signal from the fourth AND gate GA14 and the fourth count signal from the fourth bit counter 48 to detect a time point that the second to fourth bit counter 48 to detect a time point that the second to fourth count signals from the second to fourth bit counters 44, 46 and 48 are all high in logic. As a result of the AND operation, the sixth AND gate GA16 generates a pulse signal which has ¼ a frequency of the second count signal from the second bit counter 44 and the same pulse duration as that of the second count signal.

The 6-bit high-speed counter circuit further comprises a seventh AND gate GA17 for inputting the output signal from the sixth AND gate GA16 and the second clock signal at the nod 43, a fifth bit counter 50 for performing its counting operation in response to an output signal from the seventh AND gate GA17 to generate a fifth count signal, and an eighth AND gate GA18 for inputting the output signal from the sixth AND gate GA16 and the fifth count signal from the fifth bit counter 50. The seventh AND gate GA17 is adapted to transfer the second clock signal at the node 43 to a clock terminal of the fifth bit counter 50 while the output signal from the sixth AND gate GA16 is high in logic. The output signal from the seventh AND gate GA17 has ⅛ a frequency of the second clock signal at the node 43 and pulses synchronized with those of the second clock signal. The output signal from the seventh AND gate GA17 also has a pulse duration longer than that of the second clock signal at the node 43 by a propagation delay time of the seventh AND gate GA17. The fifth bit counter 50 inverts its output signal at each falling edge of the pulse signal from the seventh AND gate GA17 to generate the fifth count signal. The fifth count signal from the fifth bit counter 50 has 1/16 a frequency of the second clock signal at the node 43 and a duty cycle of 50%. The eighth AND gate GA18 ANDs the output signal from the sixth AND gate GA16 and the fifth count signal from the fifth bit counter 50 to detect a time point that the second to fifth count signals from the second to fifth bit counters 44, 46, 48 and 40 are all high in logic. As a result of the AND operation, the eighth AND gate GA18 generates a pulse signal which has ⅛ a frequency of the second count signal from the second bit counter 44 and the same pulse duration as that of the second count signal.

The 6-bit high-speed counter circuit further comprises a ninth AND gate GA19 for inputting the output signal from the eighth AND gate GA18 and the second clock signal at the node 43, and a sixth bit counter 52 for performing its counting operation in response to an output signal from the ninth AND gate GA19 to generate a sixth count signal. The ninth AND gate GA19 is adapted to transfer the second clock signal at the node 43 to a clock terminal of the sixth bit counter 52 while the output signal from the eighth AND gate GA18 is high in logic. The output signal from the ninth AND gate GA19 has 1/16 a frequency of the second clock signal at the node 43 and pulses synchronized with those of the second clock signal. The output signal from the ninth AND gate GA19 also has a pulse duration longer than that of the second clock signal at the node 43 by a propagation delay time of the ninth AND gate GA19. The sixth bit counter 52 inverts its output signal at each falling edge of the pulse signal from the ninth AND gate GA19 to generate the sixth count signal. The sixth count signal from the sixth bit counter 52 has 1/32 a frequency of the second clock signal at the node 43 and a duty cycle of 50%. Then, the sixth bit counter 52 outputs the sixth count signal to an output line 45.

In result, the first to sixth bit counters 42, 44, 46, 48, 50 and 52 are operated synchronously with the first clock signal from the input line 41 in such a manner that they generate their output signals, respectively, after the sum of propagation delay times of two AND gates and one bit counter from the falling edge of the first clock signal. Namely, the output signals from the first and second bit counters 42 and 44 are generated respectively after the sum of propagation delay times of one AND gate and one bit counter from the falling edge of the first clock signal, and the output signals from the third to sixth bit counters 46, 48, 50 and 52 are generated respectively after the sum of propagation delay times of two AND gates and one bit counter from the falling edge of the first clock signal. Therefore, the delay time from the rising or falling edge of the input clock signal to the generation of the count value can be properly set by adjusting the number of gates and bit counters.

As apparent from the above description, according to the present invention, the lowest-order and highest-order bit counters are operated synchronously with the clock signal to minimize the delay time from the clock signal application to the count value generation. Therefore, the high-speed counter circuit of the present invention can perform the counting operation at high speed. Further, the high-speed counter circuit of the present invention can adjust the delay time from the application of the clock signal to the generation of the count value as needed, so that the count value can be readily matched with output signals from other circuits.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A high-speed counter circuit comprising:

an input line for inputting a clock signal;

at least two bit counters connected in series and generating a count value of at least two bits in response to the clock signals from said input line; and at least one clock synchronizing means, responsive to an output signal from at least one higher-order bit counter of said at least two bit counters, for synchronizing said bit counters and for transferring the clock signal from said input line to a lower-order bit counter of said at least two bit counters.

2. The circuit of claim 1, further comprising:

logic means for detecting a time point that the output signal from said at least one higher-order bit counter has a specified logic value; and switching means for transferring the clock signal from said input line to said lower-order bit counter in response to an output signal from said logic means;

wherein said specified logic value is high.

3. The circuit of claim 2, wherein said logic means includes:

an AND gate for performing and AND operation with respect to the output signal from said at leas one higher-order bit counter.

4. The circuit of claim 2, wherein said switching means includes:

an AND gate for transferring the clock signal from said input line to said lower-order bit counter while the output signal from said logic means has the specified logic value.

5. A high-speed counter circuit as set forth in claim 1, further comprising delay means for delaying the clock signal from said input line by a propagation delay time of said at least one clock synchronizing means and applying the delayed clock signal to a highest-order bit counter of said at least two bit counters.

6. A high-speed counter circuit as set forth in claim 5, wherein said delay means includes a logic gate for delaying the clock signal from said input line in response to a drive voltage.

7. A high-speed counter circuit as set forth in claim 6, wherein said drive voltage is high in level.

8. A high-speed counter circuit as set forth in claim 7, wherein said logic gate includes and AND gate.

9. A high-speed counter circuit comprising:

an input line for inputting a clock signal;

at least two bit counters for generating a count value of at least two bits in response to the clock signals from said input line;

at least one clock synchronizing means, responsive to an output signal from at least one higher-order bit counter of said at least two bit counters, for transferring the clock signal from said input line to a lower-order bit counter of said at least two bit counters;

logic means for detecting a time point that the output signal from said at least one higher-order bit counter has a specified logic value; and switching means for transferring the clock signal from said input line to said lower-order bit counter in response to an output signal from said logic means.

10. A high-speed counter circuit as set forth in claim 9, wherein said specified logic value is high.

11. A high-speed counter circuit as set forth in claim 10, wherein said logic means includes an AND gate for performing and AND operation with respect to the output signal from said at least one higher-order bit counter.

12. A high-speed counter circuit as set forth in claim 10, wherein said switching means includes an AND gate for transferring the clock signal from said input line to said lower-order bit counter while the output signal from said logic means has the specified logic value.

13. The circuit of claim 9, further comprising:

delay means for delaying the clock signal from said input line by a propagation delay time of said at least one clock synchronizing means and for applying the delayed clock signal to a highest-order bit counter of said at least two bit counters.

14. The circuit of claim 13, wherein said delay means includes:

a logic gate for delaying the clock signal from said input line in response to a drive voltage.

15. The circuit of claim 14, wherein said drive voltage is high.

16. The circuit of claim 15, wherein said logic gate includes an AND gate.

* * * * *